United States Patent [19]

Kamio et al.

[11] Patent Number: 5,087,429
[45] Date of Patent: Feb. 11, 1992

[54] METHOD AND APPARATUS FOR MANUFACTURING SILICON SINGLE CRYSTALS

[75] Inventors: Hiroshi Kamio, Tokyo; Kenji Araki; Yoshinobu Shima, both of Yokohama; Makoto Suzuki; Akira Kazama, both of Kawasaki; Shigetake Horie, Tokyo; Yasumitsu Nakahama, Yokohama, all of Japan

[73] Assignee: NKK Corporation, Tokyo, Japan

[21] Appl. No.: 343,833

[22] Filed: Apr. 26, 1989

[30] Foreign Application Priority Data

| Apr. 28, 1988 | [JP] | Japan | 63-104278 |
| May 11, 1988 | [JP] | Japan | 63-112614 |
| May 30, 1988 | [JP] | Japan | 63-130269 |
| May 31, 1988 | [JP] | Japan | 63-131653 |
| Aug. 24, 1988 | [JP] | Japan | 63-208446 |

[51] Int. Cl.⁵ .................... C30B 35/00; C30B 29/06; C30B 15/02
[52] U.S. Cl. .................... 422/249; 422/248; 156/617.1; 156/620.4; 156/DIG. 64; 156/DIG. 83; 156/DIG. 115
[58] Field of Search .............. 156/617.1, 620.3, 620.4, 156/DIG. 64, DIG. 83, DIG. 115; 422/245, 248, 249

[56] References Cited

U.S. PATENT DOCUMENTS

| 2,892,739 | 10/1954 | Rusler | 156/617.1 |
| 3,265,469 | 9/1964 | Hall | 156/617.1 |
| 4,238,274 | 12/1980 | Chu et al. | 156/DIG. 83 |
| 4,389,377 | 6/1983 | Duncan et al. | 156/DIG. 84 |
| 4,659,421 | 4/1987 | Jewett | 156/DIG. 64 |
| 4,786,479 | 11/1988 | Hundal et al. | 422/245 |

FOREIGN PATENT DOCUMENTS

| 0229322 | 7/1987 | European Pat. Off. . |
| 2526072 | 11/1975 | Fed. Rep. of Germany ... 156/DIG. 83 |
| 2821481 | 11/1979 | Fed. Rep. of Germany . |
| 56-11675 | 3/1981 | Japan . |
| 56-23679 | 3/1981 | Japan . |
| 56-84397 | 7/1981 | Japan . |
| 56-88896 | 7/1981 | Japan . |
| 56-164097 | 12/1981 | Japan . |
| 58-36997 | 3/1983 | Japan . |
| 58-130195 | 8/1983 | Japan . |
| 58-172289 | 10/1983 | Japan . |
| 59-141578 | 9/1984 | Japan . |
| 61-36197 | 2/1986 | Japan . |
| 62-241889 | 10/1987 | Japan . |
| 62-278188 | 12/1987 | Japan . |
| 63-95195 | 4/1988 | Japan . |

Primary Examiner—Gary P. Straub

[57] ABSTRACT

The present invention relates to a method and apparatus for manufacturing silicon single crystals by the Czochralski method, including the steps of dividing a crucible containing molten silicon into an inner single crystal growing section and an outer material feeding section to allow said molten silicon to move slowly, and pulling a silicon single crystal from said single crystal growing section while continuously feeding silicon starting material to said material feeding section, the improvement wherein temperatures of said material feeding section and said molten silicon are maintained higher than a melting point of silicon by at least more than 12° C.

3 Claims, 8 Drawing Sheets

FIG. I

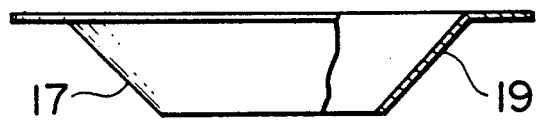
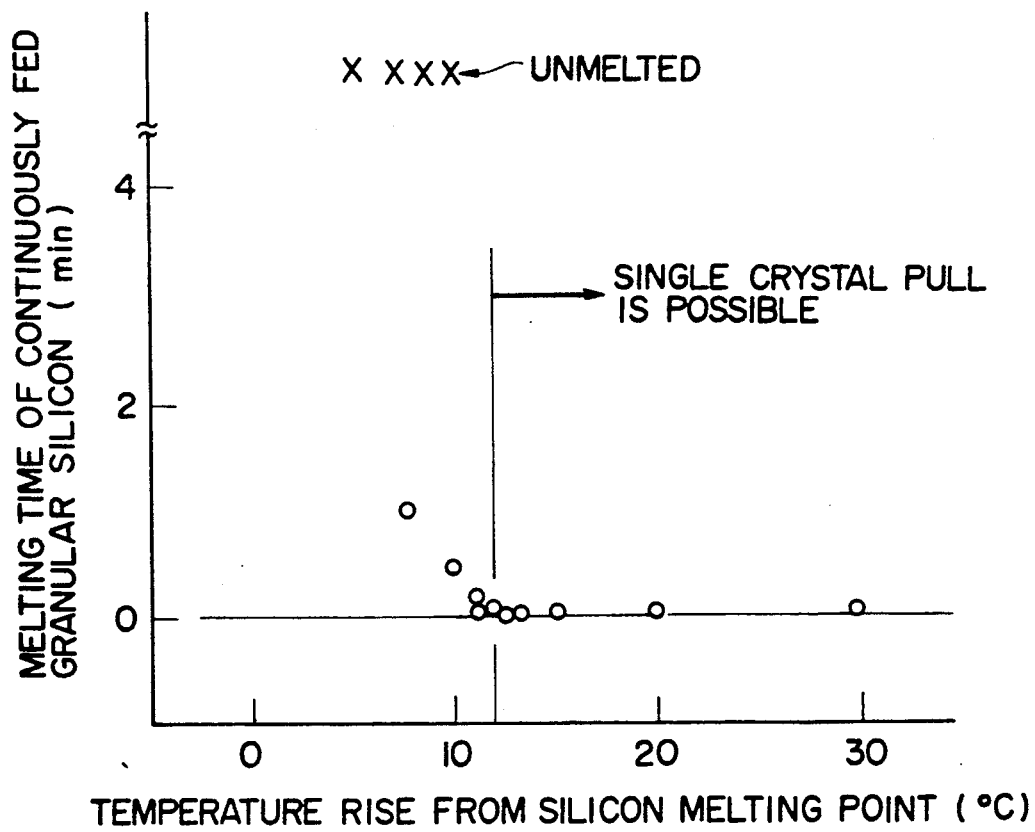

METHOD AND APPARATUS FOR MANUFACTURING SILICON SINGLE CRYSTALS

BACKGROUND OF THE INVENTION

1. Field of the Invention

The present invention relates to a method and apparatus for manufacturing silicon single crystals by the Czochralski method.

2. Description of the Prior Art

The manufacturing method of silicon single crystals by the Czochralski method has heretofore been in use and it has become substantially a complete technique.

In accordance with this technique, as is well known in the art, after a molten silicon material has been charged into a quartz crucible, a seed crystal is brought into contact with the surface of the molten material and simultaneously the need crystal is slowly rotated and pulled from the melt, thereby causing the contact surface to solidify and growing a crystal to obtain a cylindrical single crystal.

At this time, in order to produce a silicon single crystal as a p-type or N-type semiconductor in dependence on the purpose, a suitable amount of a dopant such as boron, antimony or phosphorous is introduced into the molten material. However, the introduction of such dopant into a silicon single crystal is not uniform so that lower the portion of the silicon single crystal, greater is the concentration of the dopant.

Also, in addition to the dopant introduced intentionally into the silicon single crystal as mentioned above, impurities introduced unavoidably during the manufacture, such as, oxygen and carbon are present in considerable amounts. In other words, since the characteristics and the yield of the semiconductor can be improved by the oxygen introduced into the silicon single crystal and thus it is desirable that the oxygen is contained uniformly within the silicon single crystal from top to bottom, generally the lower the portion of the crystal, gets the lower the oxygen concentration becomes.

This is because of the fact that the molten material in the crucible is decreased, as a silicon single crystal is pulled, and the concentration of the dopant is increased and the concentration of oxygen is decreased in the molten material in the crucible. As a result, the dopant present in the pulled and grown silicon single crytal is gradually increased and the oxygen is decreased, thus giving rise to a problem that the quality of the produced silicon single crystal varies along the pulling direction.

Where the specification relating to the components are severe, there is the possibility of the yield of usable wafers being decreased to less than 50% due to such maldistributions of the dopant and oxygen.

As an effective means of overcoming these deficiencies, there have been known methods of continuously or intermittently feeding a silicon starting material so as to maintain constant the liquid level of the molten material. Included among the methods of pulling a silicon single crystal while continuously or intermittently feeding the silicon starting material in such a manner are the inventions disclosed for example in Japanese Laid-Open Patents No. 56-84397 and No. 56-164097.

The former invention relates to a method of manufacturing single crystals by inserting into the molten or liquid starting material in a crucible starting material ingots in the form of single crystals pulled from a molten material of the same composition as the molten starting material and having the same form as the desired single crystal to be grown at a constant rate.

On the other hand, the latter invention relates to a single crystal pull apparatus equipped with a molten material feeder whereby a powdered sample feed tube is externally inserted into an insulating tube and a powdered sample is temporarily stored and melted in the forward end of the powdered sample feed tube thereby intermittently supplying the molted material into a crucible, and these methods have not been put in practical use due to their technical difficulties encountered.

Then, recently the manufacture of high-quality granular polycrystalline silicon has been made possible and it has been considered comparatively easy to feed such granular silicon continuously at a constant rate into the molten starting material as will be seen from Japanese Laid-Open Patent No. 58-172289. However, due to the fact that the falling of the granular silicon onto the surface of the molten starting material causes the solidification to start from the granular silicon, as a principle, it is impossible to use this method to continuously feed granular silicon and grow a single crystal. The solidification starts from the fallen granular silicon for the reasons enumerated as follows.

(a) The melt temperature at the time of pulling a single crystal is just above the melting point of silicon as will be seen from the above-mentioned principle.

(b) The specific gravity of silicon is smaller in solid form than in liquid form and therefore granular silicon floats on the surface of the molten material.

(c) The emissivity of silicon is greater in solid form than in liquid form.

In other words, the granular silicon floats on the surface of the molten silicon of the temperature just above its freezing point so that the heat is rapidly dissipated as radiant heat from the granular silicon and the solidification progresses around the floating granular silicon. In addition, the ripples caused by the falling of the granular silicon gives rise to a problem.

On the other hand, the inventions disclosed in Japanese Laid-Open Patents No. 56-88896 and No. 58-36997 are known in the field of oxide semiconductors. In accordance with these inventions, the diameter of a crystal to be pulled is small so that a small metal crucible of the double type can be used and the double crucible can be heated directly by induction heating, thereby preventing any solidification of the melt between the crucibles. In the case of silicon single crystals, however, it is impossible to use a metal crucible due to the large diameter of single crystals to be pulled, the increased cost and the occurrence of contamination, and therefore a high-purity quartz crucible is generally used. As a result, such induction heating method cannot be used for the manufacture of silicon single crystals.

On the other hand, the invention disclosed in Japanese Laid-Open Patent No. 58-130195 employs a quartz crucible of the double structure type and at glance it appears to have immunity for the solidification in the starting material melting portion. However, as pointed out (at lines 12 to 16 of "Problems that the Invention is to Solve, p. 2, Japanese Laid-Open Patent No. 62-241889), the problem of solidification at the portion in contact with the molten material surface in the inner crucible has not been solved as yet.

Also, in accordance with this invention a silicon starting material feed pipe is inserted between the inner and outer crucibles so that the supply of the starting material is effected by the feed pipe immersed in the molted material on the outer side of the inner crucible. Thus, with such feeding method, the silicon starting material is not melted instantaneously at the molten material surface and, although heated to an elevated temperature, the starting material in solid form is accumulated as such within the feed pipe. Once the accumulation takes place, there is a problem that sintering is caused among the particulate material and between the material and the feed pipe inner wall, thus making impossible the subsequent supply of the material. For these reasons, this invention has not been put in practice as yet.

The invention disclosed in Japanese Laid-Open Patent No. 63-95195 is an improvement on the above-mentioned invention (Japanese Laid-Open No. 58-130195). This invention is constructed so that the interior of a crucible is divided into a crystal growing section and a starting material melting section by a ring-shaped partition and the growing of a crystal is effected while charging granular starting material into the starting material melting section. The improvement on the invention of Japanese Laid-Open Patent No. 58-130195 resides in that a second heater of the annular shape is arranged at the bottom portion of the crucible so as to prevent solidification of the charged starting material and facilitate its melting. However, the problem of solidification starting from the contacting portion with the molten material surface on the inner side of the partition has not been fully solved even in accordance with this invention as yet.

Those silimar to the above-mentioned inventions (Japanese Laid-Open Patents No. 58-130195 and No. 63-93195) include the inventions disclosed in Japanese Laid-Open Utility Model No. 59-141578 and Japanese Laid-Open Patent No. 62-241889 and the invention introduced by the paper in Ann. Rev. Mater. Sci, 1987, Vol. 17, P. 273-279. The first invention (Japanese Laid-Open Utility Model No. 59-141578) shows that a ring-shaped object is floated within the molten material or melt. In this invention, however, there is a convection of the melt between the single crystal pull section and the granular starting material feed section below the floating ring and the temperature on the outer side of the floating ring attains as a principle a temperature just above the melting point of silicon which is substantially equal to that of the single crystal pull section. Thus, the basic problem of the solidification proceeding from the granular silicon floating on the melt surface has not been solved at all. Also, no solution has been made for the problem of the progress of solidification from the floating ring as pointed out in the specification of the second invention (Japanese Laid-Open Patent Specification No. 62-241889, "Problems that the Invention is to solve", lines 12-16), and only the problem of ripples has been solved.

On the other hand, the second invention (Japanese Laid-Open Patent No. 62-241889) shows the provision of a vertical trough along the outer side of a crucible so as to feed silicon starting material into the crucible through the holes formed through the crucible. However, the volume of the material melting section of the vertical trough is so small that if silicon starting material having a very high latent heat of fusion is fed continuously, it eventually becomes impossible to melt the material any longer. In addition, the holes are close to the molten material surface so that the melts of different concentrations are entrained on the convection to move straight to the single crystal interface, thus tending to cause concentration variations and thereby impeding the growth of a high-quality crystal. In addition, the invention requires the processing of a quartz crucible requiring a very high processing cost, thus increasing the cost.

Also, the invention reviewed on the paper (Ann. Rev. Mater. Sci, 1987, vol. 17, P. 273-279) employs a double crucible and partition rings of the fixed type and floating type, respectively, and the problem of solidification from the partition rings remain still unsolved.

On the other hand, the invention disclosed in the Japanese Laid-Open Patent No. 61-36197 shows that a crucible is divided by a partition ring and a heat insulation cover is disposed only above a peripheral starting material melting section to increase the temperature of the melting section and thereby to promote the melting of the starting material. However, this invention is merely intended for heat insulation of the starting material melting section and there is no solution for the problem that during the pulling of a silicon single crystal the inner side of the partition ring is cooled and thus the solidification starts from the partition ring.

The following difficulties will be encountered if a single crystal is pulled while continuously and directly feeding granular silicon into a crucible.

(1) While the temperature of a melt attains a value which is considerably close to the melting point of silicon during the pulling of a silicon single crystal, if, in this condition, granular silicon of a temperature close to the room temperature is fed continuously to the outer side of the partition ring, the granular silicon is no longer melted so that the granular silicon in solid form floats as such on the surface of the melt and the melt solidifies and grows with the granular silicon as a nucleus.

(2) Where the granular silicon melting section and the single crystal pull section are separated, due to the so-called fin effect in the heat transfer and the higher emissivity than the silicon melt, solidification tends to occur from this partition portion so that once the solidification occurs, the solidified material continues to grow and the growth of a sound silicon single crystal is impeded.

SUMMARY OF THE INVENTION

The present invention has been made with a view to overcoming the foregoing problems in the prior art and it is the primary object of the invention to provide a method and apparatus for manufacturing silicon single crystals by continuously feeding silicon starting material in granular or small lump form into a crucible containing molten starting material, in which the silicon starting material in granular or small lump form is positively melted so as to prevent the solidification of the liquid from the partition portion and not impede the growth of a silicon single crystal, thereby manufacturing a silicon single crystal having a dopant concentration and an oxygen concentration which are substantially constant in the pull direction.

Thus, in accordance with the present invention there is provided a silicon single crystal manufacturing method in which a crucible containing molten silicon is divided into an inside single crystal growing section and an outside material feeding section to allow the molten silicon to move gently and a silicon single crystal is pulled from the single crystal growing section while continuously feeding silicon starting material and which has the following features:

(1) The temperatures of the material feeding section and the molten silicon are held higher that the melting point of silicon by at least over 12° C.

(2) In the method, heat insulation is provided so as to cover the exposed portion of the partition from the molten material surface and the material feeding section side of the partition.

(3) Substantially ring-shaped heater means arranged above the material feeding section and the partition to cover them is heated so as to maintain the temperatures of the partition and the molten silicon in the material feeding section higher than the temperature of the molten silicon in the single crystal growing section.

(4) The molten silicon in the crucible is heated by heating means arranged on the outer side of the crucible and simultaneously the molten silicon in the material feeding section is heated by heating means arranged in the material feeding section such that its part is immersed in the molten silicon in the material feeding section.

(5) In the above (1) to (4), the molten silicon in the crucible is heated by heating means arranged on the outer periphery of the crucible and heating means arranged below the crucible.

(6) Further in the above (1) to (5), the contact area between the molten silicon and the crucible in the material feeding section is set to 30 to 75% of the contact area between the molten silicon and the crucible in the crucible on the whole, and also the free surface area of the molten silicon in the material feeding section is set to 10 to 70% of the free surface area of the molten silicon in the crucible on the whole.

Also, in accordance with the invention there is provided an apparatus for performing the above-mentioned method to pull the molten silicon contained in a crucible to manufacture a silicon single crystal, and the apparatus has the following features.

(1) There are provided partition means formed with at least one small hole therethrough, arranged inside the crucible to surround a silicon single crystal to be pulled and positioned to divide the crucible into a single crystal growing section and a material feeding section, granular silicon feed means arranged above the material feeding section, heat insulation means for covering the exposed portion of the partition means from a melt surface and the material feeding section, and heating means for separately heating the side wall and the bottom of the crucible.

(2) There are provided partition means formed with at least one small hole therethrough and arranged within the crucible to divide the crucible into a single crystal growing section and a material feeding section, granular silicon feed means arranged above the material feeding section, substantially ring-shaped heater means arranged above the material feeding section and the partition means to cover both of them, and heating means for separately heating the side wall and the bottom of the crucible.

(3) There are provided partition means formed with at least one small hole therethrough and arranged within the crucible so as to surround a silicon single crystal to be pulled and to divide the crucible into a single crystal growing section and a material feeding section, granular silicon feed means arranged above the material feeding section, heating means arranged in such a manner that its part is immersed in the molten silicon in the material feeding section and it is also vertically movable relative to the crucible, and heating means for heating the side wall of the crucible.

(4) There are provided cylindrical heating means arranged within the crucible to surround a silicon single crystal to be pulled and form a gap between it and the bottom of the crucible and positioned to divide the crucible into a single crystal growing section and a material feeding section, and granular silicon feed means arranged above the material feeding section.

(5) In the above (1) to (4), the contact area between the molten silicon and the crucible in the material feeding section is set to 30 to 75% of the contact area between the molten silicon and the crucible in the crucible on the whole, and also the free surface area of the molten silicon in the material feeding section is set to 10 to 70% of the free surface area of the molten silicon in the crucible on the whole.

BRIEF DESCRIPTION OF THE DRAWINGS

FIG. 4 is a side view showing an embodiment of the heat insulating plate with its part shown in section.

FIG. 5 is a graph showing the relation between the melting time of the granular silicon and the temperature rise from the melting point of silicon.

DESCRIPTION OF THE PREFERRED EMBODIMENTS

Figure 1:
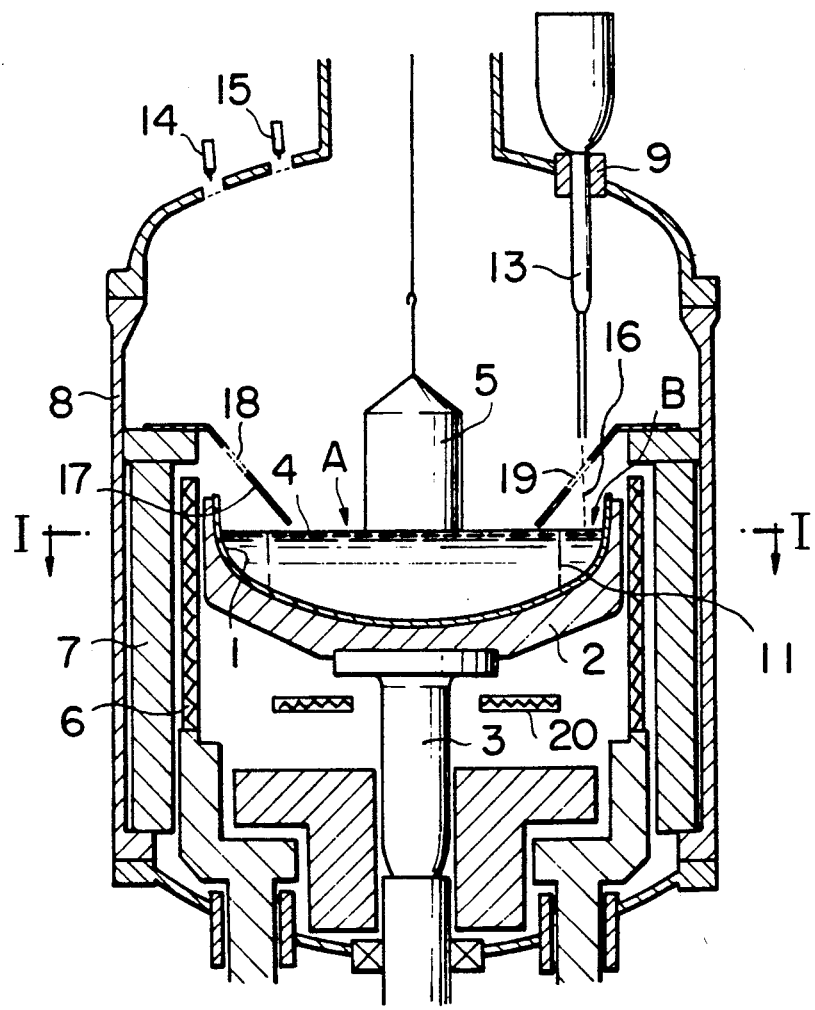
FIG. 1 is a longitudinal sectional view showing schematically an embodiment of the present invention.
Figure 2:
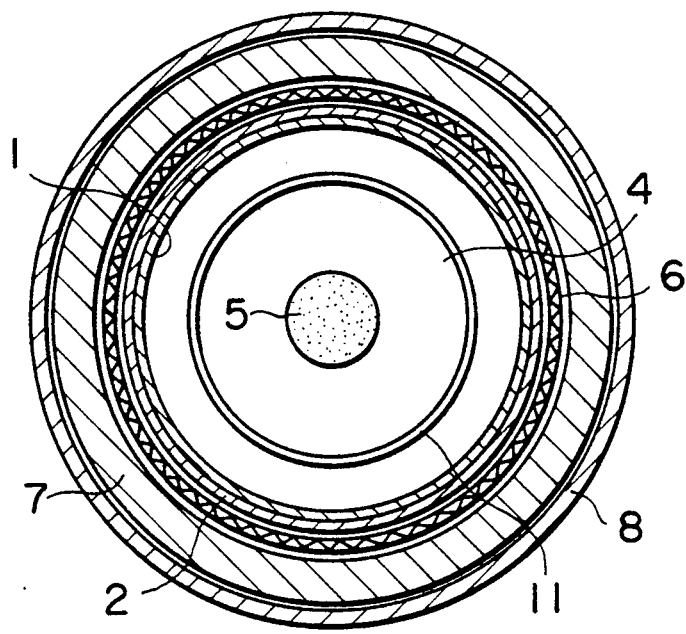
FIG. 2 is a sectional view taken along the line I—I of FIG. 1.

FIG. 1 is a longitudinal sectional view schematically showing an embodiment of the present invention, and FIG. 2 is a sectional view taken along the line I—I of FIG. 1. In the Figures, numeral 1 designates a quartz crucible set inside a graphite crucible 2 which in turn is vertically movably and rotatably supported on a pedestal 3. Numeral 4 designates the molten material contained in the crucible 1 and a silicon single crystal 5 grown into a cylindrical shape is pulled from the molten material. Numeral 6 designates a heater surrounding the graphite crucible 2, and 7 a hot zone heat insulating material surrounding the heater 6. These component parts are accommodated in a chamber 8 and they are basically the same as the ordinary silicon single crystal manufacturing apparatus according to the Czochraski method.

Figure 3:
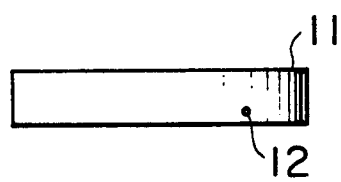
FIG. 3 is a side view showing an embodiment of the partition means.

Numeral 11 designates a ring-shaped partition member made from a high-purity quartz and concentrally arranged within the crucible 1 and it is formed with one or more small holes 12 in the area lower than substantially the central portion in the height direction as shown by way of example in FIG. 3. The partition member 11 is set, along with a starting material, inside the crucible 1 during the charging of the starting material so that after the starting material has been melted, the partition member 11 is disposed in a melt 4 so as to surround the silicon single crystal 5 and its upper edge portion is slightly exposed from the surface of the melt. Also, its lower edge portion is substantially fused to the crucible 1 and there is no possibility of its floating. As a result, the molten material on the outside of the partition member 11 (hereinafter referred to as a material feeding section B) is allowed to gently move only through the small holes 12 to the inner side (hereinafter referred to as a single crystal growing section A) and therefore the material feeding section B and the single crystal growing section A can be separated satisfactorily.

Numeral 9 designates an opening formed in the chamber 8 in correspondence to the melt surface in the material feeding section B, and fixedly inserted in the opening 9 is a feeder 13 for feeding silicon starting material in granular or lump form (hereinafter referred to granular silicon) and the forward end of the feeder 13 is in opposition to the melt surface of the material feeding section B. The feeder 13 is connected to a starting material feed chamber (not shown) arranged externally of the chamber 8 thereby continuously feeding granular silicon 16 to the material feeding section B.

Numerals 14 and 15 designate temperature detectors such as radiation thermometers which are arranged above the chamber 8 such that the temperature detector 14 measures the temperature at the melt surface of the material feeding section B and the other temperature detector 15 measures the temperature at the melt surface of the single crystal growing section A.

Numerals 17 designates a heat insulating plate which comprises a high-strength graphite plate as shown in FIG. 4. It is to be noted that from the contamination prevention point of view, the lower surface or the whole surface of the graphite plate should preferably be covered for example by a high-purity quartz of about 3 mm thick or surface coating of a high-purity SiC or $Si_3N_4$. The heat insulating plate 17 has its outer periphery supported on the hot zone that insulating member 7 and it is set so as to surround the partition plate 11 and the material feeding section B. The heat insulating plate 17 is arranged in such a manner that its bottom (inner peripheral portion) is positioned close to the surface of the melt (at a distance of about 10 mm in this embodiment) so as to prevent the solidification of the molten material occurring at the exposed portion of the partition member 11 from the melt and to enhance the heat insulation effect on the melt in the material feeding section B. Numeral 18 designates a hole formed in correspondence to the visual field of the temperature detector 14, and 19 a hole formed in the feeding path of the granular silicon 16.

Also, in accordance with the invention a heater 20, which is separated from the heater 6, is arranged at the bottom of the graphite crucible 2 in which the crucible 1 is set, thereby more positively controlling the surface temperatures of the melts in the single crystal growing section A and the material feeding section B. By controlling the heaters 6 and 20, the granular silicon 16 can be positively melted in the material feeding section B and also in the single crystal growing section A the melt can be maintained at a temperature which does not impede the growth of a silicon single crystal.

In the embodiment of the invention constructed as described above, the molten material 4 is contained on the inner and outer sides of the partition member 11 disposed within the crucible 1 and the surfaces of these melts are held on the same level. Then, after a seed crystal has been brought into contact with the surface of the melt in the single crystal growing section A, the seed crystal is slowly rotated and pulled from the melt so that the growth of the crystal takes place along with the solidification of the contacting liquid surface and the cylindrical silicon single crystal 5 is produced. During the interval, the granular silicon 16 is fed continuously from the feeder 13 onto the surface of the melt in the material feeding section B so that the granular silicon 16 is melted by the melt in the material feeding section B and it is gently moved into the single crystal growing section A through the holes 12 of the partition member 11, thereby maintaining the surface level of the molten material 4 constant at all times. At this time, any ripple caused by the feeding of the granular silicon 16 onto the surface of the melt in the material feeding section B is prevented by the partition member 11 and no ripple is propagated to the single crystal growing section A.

Then, the fact that the lower end of the material feeder 13 is positioned above the surface of the melt so as to drop the granular silicon 16 onto the melt surface has the purpose of causing the granular silicon 16 to float on the surface of the melt in the whole area of the material feeding section B and it is melted in the whole area of the material feeding section B. If the forward end of the feeder 13 is immersed in the melt, the melting zone of the granular silicon 16 is limited to the inside of the feed pipe with the result that the transfer of heat to the granular silicon 16 from the melt becomes insufficient and the granular silicon 16 cannot be melted continuously.

With the embodiment constructed as described above, the following considerations must be given to the diameter and the number of small holes 12 formed in the partition member 11. If the diameter of the small holes 12 is excessively large or its number is excessively large, the convection of the melt is caused between the single crystal growing section A and the material feeding section B. In other words, the low temperature melt in the single crystal growing section A flows into the material feeding section B and therefore it is difficult to maintain the melt temperature of the material feeding section B at a value higher than the melting point of silicon by more than 12° C. as will be described later. In this embodiment, the diameter of the small holes 12 is 5 mm∅ and the number is 2.

Also, the results of temperature measuring experiments have shown that the temperature of the melt in the material feeding section B must be higher than the melting point of silicon by at least more than 12° C. as shown in FIG. 5 in order to pull a sound silicon single crystal 5 while preventing the continuously fed granular silicon 16 from causing solidification of the melt and preventing any solidification of the melt occurring from around the partition member 11. For this reason, in accordance with the invention the heat insulating plate 17 is provided to prevent the occurrence of solidification from around the partition member 11 and to reduce the radiation of the heat from the melt in the material feeding section B to provide a heat insulation effect and also the heaters 6 and 20 are arranged on the outer side of the graphite crucible 2 so as to simultaneously ensure the melting of the granular silicon 16 and the growth of the silicon single crystal 5 within the single crucible 1. In other words, the heater 6 arranged at the side of the crucible 1 and the heater 20 arranged at the bottom of the crucible 1 share their subjective roles, that is, the former melts the granular silicon 16 fed to the material feeding section B and the latter adjusts the temperature of the single crystal growing section A, and the heaters 6 and 20 respectively control the single crystal growing temperature and the granular silicon melting temperature (higher than the melting point of silicon by at least more than 12° C.) while detecting the temperatures of the two melt surfaces by the temperature detectors 14 and 15.

Figure 6:
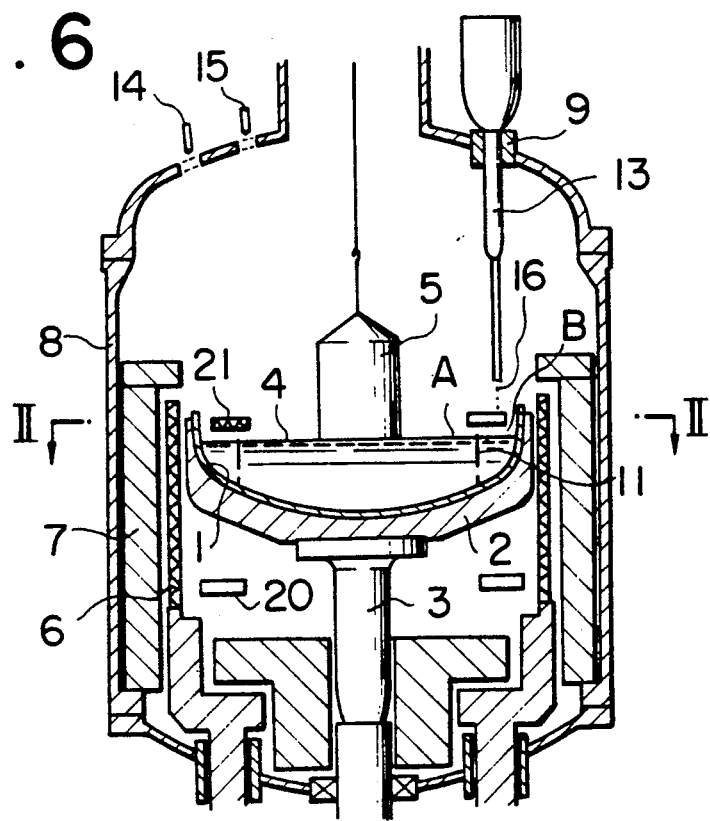
FIGS. 6 to 11 are respectively longitudinal sectional views and their II—II, III—III and IV—IV sectional views of another embodiments of the invention.
Figure 7:
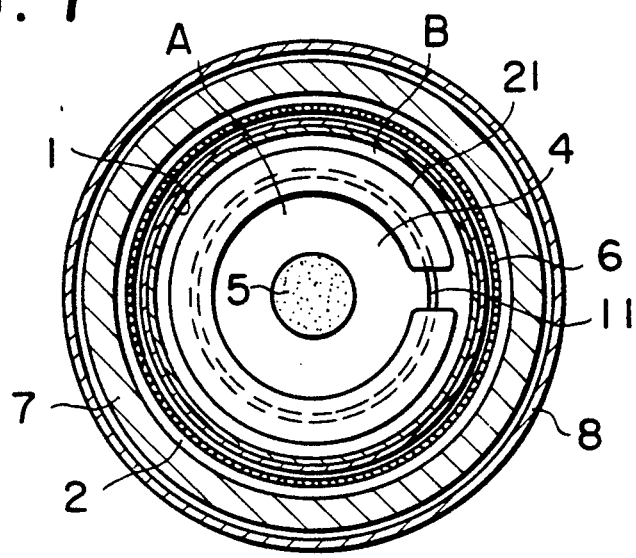

FIG. 6 is a longitudinal sectional view showing schematically another embodiment of the invention, and FIG. 7 is a sectional view taken along the line II—II of FIG. 6. This embodiment differs from the embodiment of FIG. 1 in that a heater element 21 is arranged above the material feeding section B and the partition number 11 so as to cover them and it comprises for example a substantially ring-shaped graphite heater element of the electric resistance heating type. During the charging of silicon starting material, the heater element 21 is moved upward above the crucible 1 or the crucible 1 is moved downward to make easy charging. Also, the heater element 1 is moved downward or the crucible is moved upward when the silicon starting material has been melted. The portion of the heater element 21 which is positioned above the material feeding section B heats the melt 4 in the material feeding section B and the other portion positioned above the partition member 11 heats the upper part of the partition member 11 by the radiation heat. The heater element 21 may be comprised of a nichrome wire or the like provided that the same effect is ensured. Note that in this embodiment, the heat insulating plate 17 shown in the embodiment of FIG. 1 is not needed.

In this embodiment, by controlling the heater 6 and the heater element 21 to maintain the melt surface of the material feeding section B and the upper part of the partition number 11 at elevated temperatures, the temperature of the melt in the material feeding section B is maintained higher than the melting point of silicon by at least more than 12° C. to positively melt the granular silicon 16 and also in the single crystal growing section A the occurrence of solidification from the partition member 11 is prevented thereby maintaining the melt at a temperature which does not impede the growth of a silicon single crystal 5.

Figure 8:
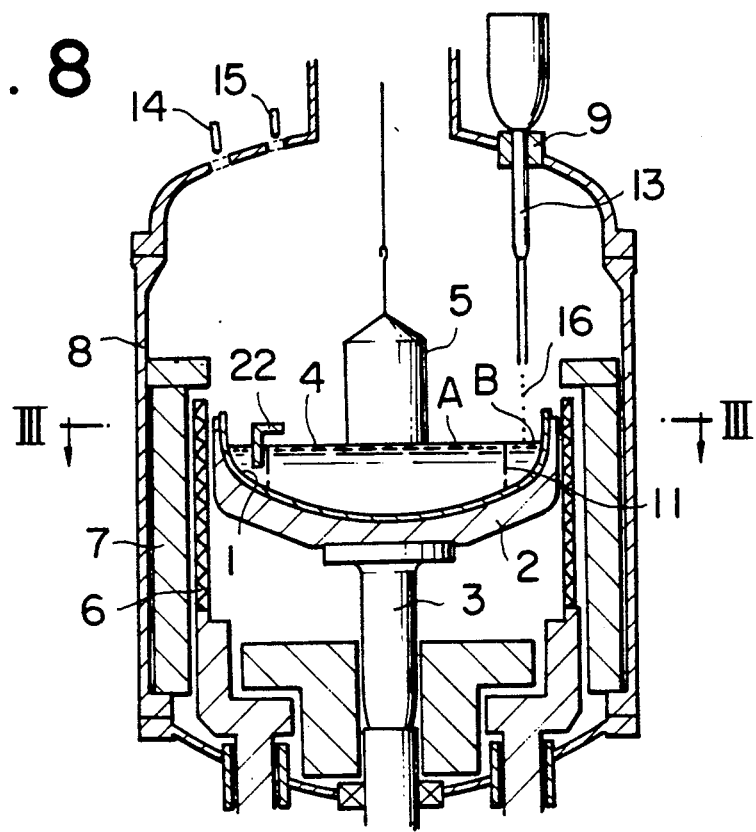
Figure 9:
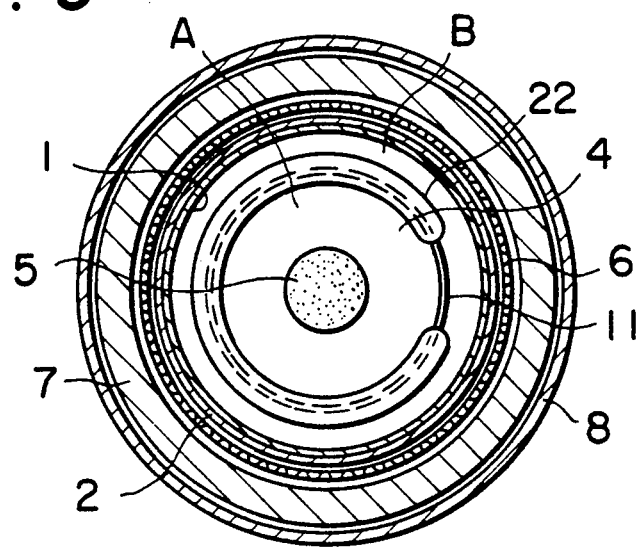

FIG. 8 is a longitudinal section view showing schematically another embodiment of the invention, and FIG. 9 shows a sectional view taken along the line III—III of FIG. 8. This embodiment is the same with the embodiment of FIG. 1 except the provision of a heater element 22 comprising for example a resistance heater element which is formed into a substantially horseshoe shape, having an L-shape in section and covered by a high-purity silica glass or the like. During the charging of silicon starting material, the heater element 22 is moved upward above the crucible 1 or the crucible 1 is moved downward so as to facilitate the charging, whereas when the silicon starting material has been melted, the heater element 22 is moved downward or the crucible 1 is moved upward thereby immersing the heater element 22 in the outer side of the partition member 11 or in the melt 4 of the material feeding section B up to substantially the central portion in the height direction. The portion of the heater element 22 immersed in the melt 4 heats the melt 4 in the material feeding section B and the other portion not immersed in the melt 4 heats the upper part of the partition member 11 by radiation heat. Note that in this embodiment the heater 20 arranged below the crucible 1 is omitted.

In the present embodiment, by controlling the heater element 22 and the heater 6, the temperature of the melt in the material feeding section B is maintained higher than the melting point of silicon by at least more than 12° C. thus melting the granular silicon positively and also in the single crystal growing section A the melt is held at a temperature which does not impede the growth of a silicon single crystal 5.

Figure 10:
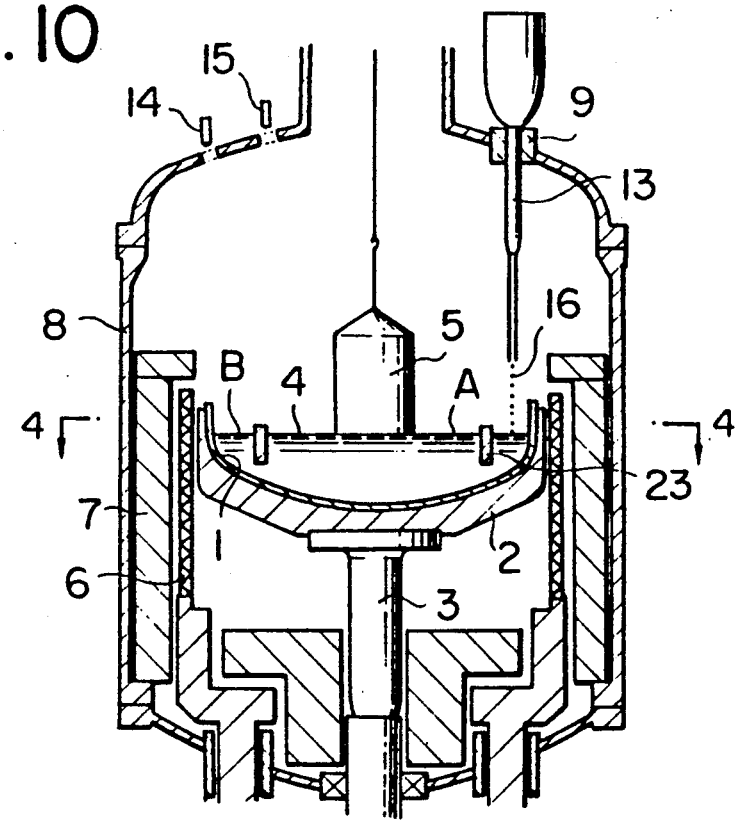
Figure 11:
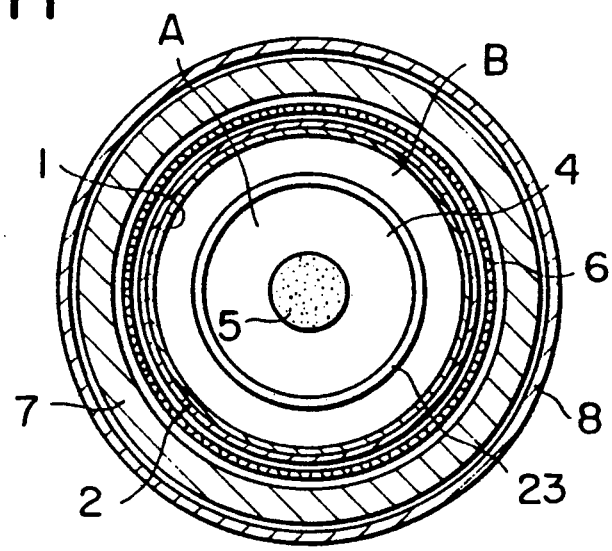
Figure 12:
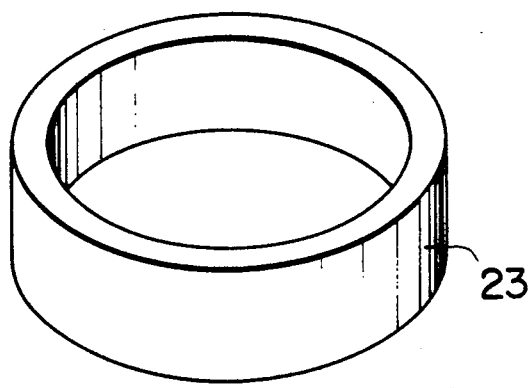
FIG. 12 is a perspective view showing an embodiment of the cylindrical heater.

Referring to FIGS. 10 and 11, there are illustrated respectively a longitudinal sectional view showing schematically still another embodiment of the invention and a sectional view taken along the line IV—IV of FIG. 10. This embodiment differs from the embodiment of FIG. 1 in that there is provided a cylindrical heater 23 comprising for example a resistance heater element covered by a high-purity silica glass as shown in FIG. 12, and the cylindrical heater 23 is formed concentrically with the crucible 1 such that its outer periphery is heated to a higher temperature than its inner periphery. During the charging of silicon starting material, the cylindrical heater 23 is moved upward or the crucible 1 is moved downward thereby facilitating the charging so that when the silicon starting material has been melted, the cylindrical heater 23 is moved downward or the crucible is moved upward thereby immersed the heater 23 in the melt 4 except a part thereof. When this occurs, the crucible 1 is divided into the single crystal growing section A and the material feeding section B with the result that the melt on the material feeding section side of the cylindrical heater 23 is heated to a higher temperature than the melt on the single crystal growing section A side and it is slowly moved into the single crystal growing section A through the gap in the lower part of the crucible 1.

In this embodiment, by controlling the cylindrical heater 23 and the heater 6, the temperature of the melt in the material feeding section B is maintained higher than the melting point of silicon by at least more than 12° C. thus positively melting the granular silicon and also in the single crystal growing section A the melt is maintained at a temperature which does not impede the growth of a silicon single crystal.

Then, in the silicon single crystal manufacturing method of the type which grows a single crystal while feeding the starting material, it is an essential requirement that the supplied granular silicon is melted positively and that there is caused no ill effect, e.g., any temperature variation in the silicon single crystal growing section. For this purpose, while it can be an effective means to divided the crucible into a material feeding section and a single crystal growing section, if this division is not appropriate, unsatisfactory results will be obtained as previously described in connection with the prior art by way of example. Where a partition member is placed inside the crucible to divide it into a material feeding section and a single crystal growing section, the movement of heat in the material feeding section is such that generally the heat is discharged from the portion of the contact area ($S_{BS}$) between the melt and the crucible and also the heat is consumed for melting the supplied granular silicon. Therefore, if the contact area $S_{BS}$ is increased, the heat input is increased and this is advantageous for melting the granular silicon. However, if the area $S_{BS}$ is increased excessively, the amount of heat input to the single crystal growing section is decreased thus giving rise to a problem. On the contrary, if the free surface area $S_{TS}$ is decreased, the amount of heat output is decreased and this is also advantageous from the material melting point of view.

The inventors of this invention have conducted experiments and investigation on the basis of the foregoing concept and have succeeded in dividing the crucible to ensure the proper areas $S_{BS}$ and $S_{TS}$ and thereby to positively melt the granular silicon.

Also, from the results of the temperature measuring experiments it has been found that the temperature of the melt in the material feeding section B must be higher than the melting point of silicon by at least more than 12° C. as shown in FIG. 5 in order that a sound silion single crystal is pulled while preventing the occurrence of solidification of the melt due to continuously fed granular silicon and preventing the occurrence of solidification from around the partition member as mentioned previously. Therefore, in this embodiment partition means has been obtained by experiments which prevents the occurrence of solidification from the exposed portion of the partition member from the melt and is capable of positively melting the supplied granular silicon and ensuring the previously mentioned melt temperature.

Figure 13:
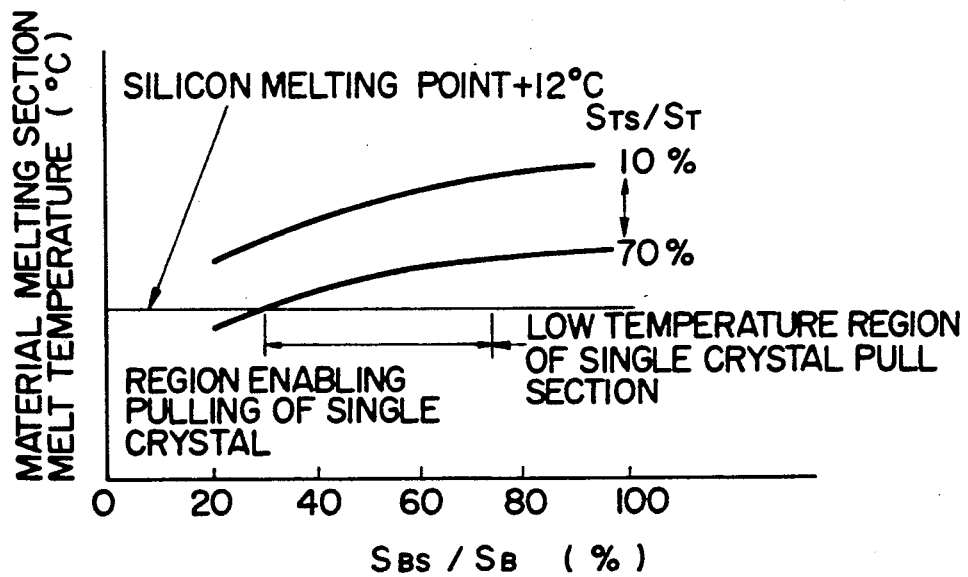
FIG. 13 is a graph showing the relation between the melt contact area and the melt surface area of the material feeding section and the crucible on the whole.

FIG. 13 shows the results. It has been found that in order to melt the granular silicon and grow a silicon crystal in the single growth section A, it is necessary to divide the crucible 1 in such a manner that the area ($S_{BS}$) of the contacting portions of the melt and the crucible 1 in the material feeding section B is set to 30 to 75% of the area ($S_B$) of the contacting portions of the melt and the crucible 1 in the crucible on the whole and that the free surface area ($S_{TS}$) of the melt in the material feeding section B is set to 10 to 70% of the free surface area ($S_T$) of the entire melt in the crucible on the whole (note that the lower limit of $S_{TS}/S_T$ is determined in accordance with the minimum space for feeding the granular silicon onto the surface of the melt). If the ratio $S_{TS}/S_T$ is large and the ratio $S_{BS}/S_B$ is excessively small, the material feeding section B cannot ensure the desired melt temperature (higher than the melting point of silicon by more than 12° C.). On the other hand, if the ratio $S_{TS}/S_T$ is small and the ratio $S_{BS}/S_B$ is excessively small, the melt in the single crystal growing section A is solidified. Therefore, it is only necessary for the shape of the partition member 11 to satisfy the above-mentioned ratios $S_{BS}/S_B$ and $S_{TS}/S_T$ or the partition conditions.

Figures 14A, 14B:
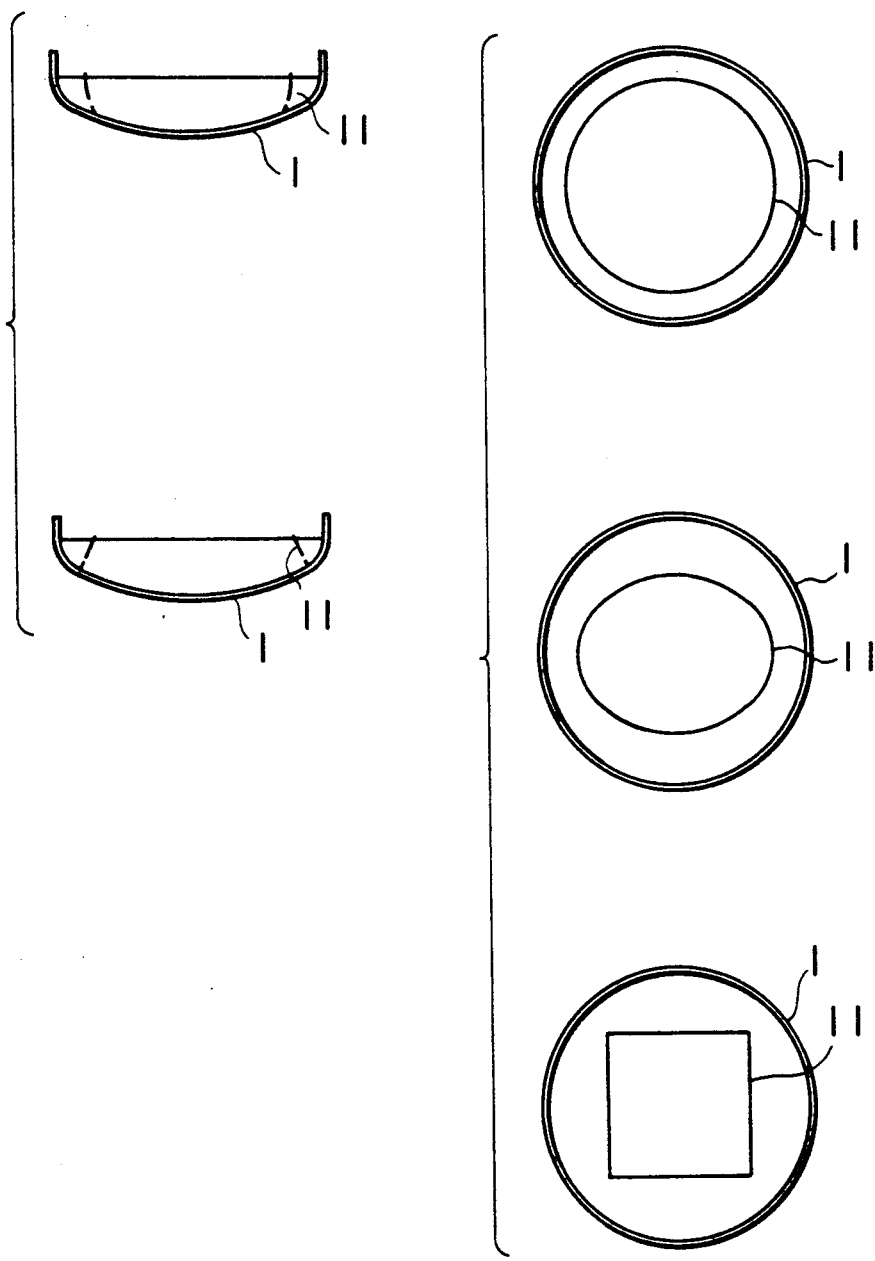
FIGS. 14(a) and (b) show respectively longitudinal sectional views and plan views showing embodiments of the partition member.

FIG. 14 shows the longitudinal sectional shapes and the cross-sectional shapes of the typical types of the partition member 11 used in the experiments. By using the various shapes of the partition member 11 resulting from the combinations of the illustrative longitudinal sectional and cross-sectional shapes, it has succeeded in pulling silicon single crystals while actually feeding the granular silicon.

While, in the above-described embodiments, the single feeder 13 is used for continuously feeding the granular silicon material 16 onto the surface of the melt in the material feeding section B, two or more feeders 13 may be provided. It is to be noted that although no description has been made since it is a matter of course with the method of pulling a silicon single crystal while feeding granular silicon, the granular silicon 16 to be fed contains the dopant in an amount corresponding to that in a silicon single crystal to be pulled. Therefore, the dopant concentration of the melt in the material feeding section is equal to the dopant concentration of a silicon single crystal to be pulled. Also, it has been confirmed that the invention can be satisfactorily carried out even in such case where a magnetic field is applied to the melt from the outside of the chamber 8.

From the foregoing description it will be seen that in accordance with the invention, sound silicon crystals can be pulled by virtue of its construction that a crucible is divided into inner and outer sections by partition means to continuously feed granular silicon onto the surface of a melt in the material feeding section so that the supplied granular silicon is melted and moved into the single crystal growing section thereby maintaining constant the surface level of the molten silicon while suppressing the temperature variations and the concentration variations, that the temperature of the melt in the material feeding section is held higher than the melting point of silicon by at least more than 12° C. by the provision of a heat insulating plate and two heaters, a ring-shaped heater element or a heating element or alternatively by the provision of a cylindrical heater in place of the partition, and that the propagation of ripples to the single crystal growing section is prevented even the granular silicon is charged continuously to the material feeding section.

Thus, the working of this invention has great effects that the yield is improved through the ensuring of the uniform quality in the pull direction, that the improved productivity is realized and so on.

It is to be noted that greater effects can be obtained by setting the contact area ($S_{BS}$) between the melt and the crucible to 30 to 75% of the contact area ($S_b$) between the melt and the crucible in the crucible on the whole and the free surface area ($S_{BS}$) of the melt in the material feeding section to 10 to 70% of the free surface area ($S_T$) of the entire melt in the crucible on the whole.

What is claimed is:

1. In an apparatus for manufacturing a single silicon crystal which comprises means for continuously feeding silicon starting materials, means for melting silicon materials in a crucible and means for pulling up a single silicon crystal and in which the inside of the crucible, containing the molten silicon and rotating at a constant speed, is divided into the raw materials feeding section and the single silicon crystal growing section by a cylindrical partition fixed at its lower end to the bottom of said crucible and having a plurality of small openings at its lower portion for allowing said molten silicon in said raw material melting section to flow slowly therethrough to said single silicon crystal growing section in one direction, the improvement which comprises setting the contact area between the molten silicon and the inner wall of the crucible in the raw material feeding section to 30 to 75% of the total contact area between the molten silicon and the crucible as a whole and the full surface area of the molten silicon in the raw materials feeding section is set to 10 to 70% of the free surface area of the molten silicon, and arranging and electric resistance side heater around said crucible for melting the silicon material and a heat keeping board for covering the upper part of said partition and the raw materials feeding section.

2. A silicon single crystal pulling apparatus according to claim 1 wherein said heat keeping board contains a heater.

3. In an apparatus for manufacturing a single silicon crystal which comprises means for continuously feeding silicon starting materials, means for melting silicon materials in a crucible and means for pulling up a single silicon crystal and in which the inside of the crucible containing the molten silicon and rotating at the constant speed, is divided into the raw materials feeding section and the single crystal growing section by a cylindrical partition fixed at its lower end to the bottom of said crucible and having a plurality of openings at its lower portion for allowing said molten silicon in said material feeding section to flow slowly therethrough to said single silicon crystal growing section in one direction, the improvement which comprises the electric resistance side heater arranged around said crucible for melting the silicon material and another electric resistance heater for covering above the top of said cylindrical partition and the free surface of the material feeding section.

* * * * *

UNITED STATES PATENT AND TRADEMARK OFFICE
CERTIFICATE OF CORRECTION

PATENT NO. : 5,087,429
DATED : February 11, 1992
INVENTOR(S) : KAMIO, et al.

It is certified that error appears in the above-identified patent and that said Letters Patent is hereby corrected as shown below:

On the title page, item [54] and Column 1, lines 2&3 amend title to read
    --APPARATUS FOR MANUFACTURING SILICON SINGLE CRYSTALS--

Signed and Sealed this

Nineteenth Day of October, 1993

Attest:

BRUCE LEHMAN

Attesting Officer    Commissioner of Patents and Trademarks